United States Patent
Cho et al.

(10) Patent No.: US 8,264,268 B2
(45) Date of Patent: Sep. 11, 2012

(54) OFFSET-VOLTAGE CALIBRATION CIRCUIT

(75) Inventors: Young Kyun Cho, Daejeon (KR); Young Deuk Jeon, Daejeon (KR); Jae Won Nam, Daejeon (KR); Jong Kee Kwon, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 141 days.

(21) Appl. No.: 12/843,535

(22) Filed: Jul. 26, 2010

(65) Prior Publication Data

US 2011/0018605 A1    Jan. 27, 2011

(30) Foreign Application Priority Data

Jul. 27, 2009 (KR) .................. 10-2009-0068479
Mar. 24, 2010 (KR) .................. 10-2010-0026365

(51) Int. Cl.
  *H03L 5/00* (2006.01)
(52) U.S. Cl. .................. 327/307; 327/331; 327/332
(58) Field of Classification Search .................. 327/307, 327/331, 332
  See application file for complete search history.

(56) References Cited

U.S. PATENT DOCUMENTS

| | | | |
|---|---|---|---|
| 4,395,681 A * | 7/1983 | Hornung et al. ............... | 330/259 |
| 4,707,624 A | 11/1987 | Yee | |
| 5,032,744 A | 7/1991 | Wai Yeung Liu | |
| 5,311,085 A | 5/1994 | Pelgrom et al. | |
| 6,084,538 A | 7/2000 | Kostelnik et al. | |
| 6,288,666 B1 | 9/2001 | Afghahi et al. | |
| 6,320,426 B1 | 11/2001 | Shih | |
| 6,710,645 B2 * | 3/2004 | Isken et al. ........................ | 330/9 |
| 7,208,980 B2 | 4/2007 | Mulder | |
| 7,511,645 B1 * | 3/2009 | Ranucci ........................ | 341/120 |
| 2007/0216557 A1 * | 9/2007 | Ebner et al. ................... | 341/143 |
| 2008/0024343 A1 * | 1/2008 | Rose et al. .................... | 341/144 |
| 2008/0129573 A1 * | 6/2008 | Mueck et al. .................. | 341/163 |

FOREIGN PATENT DOCUMENTS

| | | |
|---|---|---|
| KR | 1019990079139 A | 11/1999 |
| KR | 1019990079163 A | 11/1999 |
| KR | 1020010070958 A | 7/2001 |

OTHER PUBLICATIONS

Erkan Alpman et al., "A 1.1V 50mW 2.5GS/s 7b Time-Interleaved C-2C SAR ADC in 45nm LP Digital CMOS", IEEE International Solid-State Circuits Conference, 2009, IEEE.

Geert Van Der Plas et al., "A 150MS/s 133μW 7b ADC in 90nm digital CMOS Using a Comparator-Based Asynchronous Binary-Search sub-ADC", IEEE International Solid-State Circuits Conference, 2008, IEEE.

Zhiheng Cao et al., "A 32mW 1.25GS/s 6b 2b/step SAR ADC in 0.13μm CMOS", IEEE International Solid-State Circuits Conference, 2008, IEEE.

(Continued)

*Primary Examiner* — Ryan Jager

(57) ABSTRACT

Provided is an offset-voltage calibration circuit. The circuit includes a comparator configured to receive at least two comparison voltages and output a result of a comparison between the comparison voltages, an up/down counter (UDC) configured to output an up-counting or down-counting output signal in response to an output signal of the comparator, and a current digital-to-analog converter (DAC) configured to control the amount of current supplied from a node to which the comparison voltage is applied, in response to the output signal of the UDC and control the magnitude of the comparison voltage.

20 Claims, 4 Drawing Sheets

OTHER PUBLICATIONS

Masaya Miyahara et al., "A Low-Noise Self-Calibrating Dynamic Comparator for High-Speed ADCs".

Naveen Verma et al., "An Ultra Low Energy 12-bit Rate-Resolution Scalable SAR ADC for Wireless Sensor Nodes", IEEE Journal of Solid-State Circuits, Jun. 2007, pp. 1196-1205, vol. 42, No. 6, IEEE.

Ghazi A. Al-Rawi, "A New Offset Measurement and Cancellation Technique for Dynamic Latches", 2002, pp. 149-152, IEEE.

A. Worapishet et al., "An Improved CMOS Offset-Compensated Current Comparator for High Speed Applications", 1998, pp. 535-538, IEEE.

* cited by examiner

OFFSET-VOLTAGE CALIBRATION CIRCUIT

CROSS-REFERENCE TO RELATED APPLICATION

This application claims priority to and the benefit of Korean Patent Application Nos. 10-2009-0068479 filed Jul. 27, 2009 and 10-2010-0026365 filed Mar. 24, 2010, the disclosure of which is incorporated herein by reference in its entirety.

BACKGROUND

1. Field of the Invention

The present invention relates to an offset-voltage calibration circuit, and more specifically, to an offset-voltage calibration circuit capable of calibrating an offset voltage having an unpredicted magnitude, calibrating an offset voltage of not only a comparator but also the entire circuit, and minimizing power consumption.

2. Discussion of Related Art

In recent years, with the development of complementary metal oxide semiconductor (CMOS) technology, the demand for comparators used for circuits capable of processing analog signals, such as analog-to-digital converters (ADCs), has increased. The comparators may be circuits configured to precisely compare the voltages of two signals having a minute voltage difference therebetween and output a comparison result.

In general, a conventional comparator may include a pre-amplifier and a latch, which are connected in cascade, to enable high-speed high-resolution operation. Since the pre-amplifier has a low offset voltage and the latch has a great voltage gain, the conventional comparator may have a combination of advantages of both the pre-amplifier and the latch, thereby increasing an operating speed and accuracy.

Meanwhile, comparators with various structures have been proposed to reduce the offset voltages of the comparators. However, offset caused by mismatching of devices, which may occur during CMOS processes, may be basically unavoidable. The offset may lead to malfunctions in circuits and deteriorate linearity and noise performance of ADCs using comparators.

FIG. 1 is a circuit diagram of a comparator to which a conventional offset removing technique is applied.

Referring to FIG. 1, a comparator to which an offset removing technique is applied may include a latch and a pre-amplifier, which are connected in cascade. The conventional comparator may have the following problems. First, since output signals output from output terminals outp and outn of a pre-amplifier are directly applied to the latch, a kick-back effect may be likely to occur due to a parasitic capacitance between gate and drain electrodes of a transistor. Second, since the magnitude of an offset voltage removed from the entire circuit depends on the magnitude of current $I_{IN}$ supplied to the comparator, the magnitude of the current $I_{IN}$ should be determined by predicting an offset voltage of the comparator. That is, since the current $I_{IV}$ is not varied, the magnitude of the current $I_{IN}$ to be supplied should be determined beforehand by predicting the offset voltage of the comparator. However, when a higher offset voltage than the predicted offset voltage is caused, calibrating the offset voltage may be impossible.

Also, a conventional offset calibration circuit may remove only an offset voltage of a comparator. That is, when the comparator is applied to a successive approximation register ADC (SAR ADC), only the offset voltage of the comparator may be calibrated, while an offset voltage caused by a digital-to-analog converter (DAC) may not be removed but affect operations of the offset calibration circuit.

Accordingly, it is necessary to develop an offset voltage calibration technique capable of calibrating an offset voltage also within an unpredicted range of offset voltages, calibrating an offset voltage of not only a comparator but also a DAC as an analog block in a circuit, such as an SAR ADC, and minimizing power consumption.

SUMMARY OF THE INVENTION

The present invention is directed to an offset-voltage calibration circuit in which a circuit, such as a successive approximation register analog-to-digital converter (SAR ADC), applies a signal for enabling an offset-voltage calibration mode to a front end of a digital-to-analog converter (DAC) so that an offset voltage of not only a comparator but also the DAC can be calibrated.

Also, the present invention is directed to an offset-voltage calibration circuit in which a current source configured to supply current to a comparator is embodied as a variable current source so that even if an offset voltage departs from a previously predicted range, the offset voltage can be calibrated without changing a circuit design.

Furthermore, the present invention is directed to an offset-voltage calibration circuit in which a comparison voltage applied to a comparator may be controlled by adjusting the amount of current supplied to the offset-voltage calibration circuit without an additional current source, thereby minimizing the entire power consumption.

One aspect of the present invention provides an offset-voltage calibration circuit including: a comparator configured to receive at least two comparison voltages and output a result of a comparison between the comparison voltages; an up/down counter (UDC) configured to output an up-counting or down-counting output signal in response to an output signal of the comparator; and a current DAC configured to control the amount of current supplied from a node to which the comparison voltage is applied, in response to the output signal of the UDC and control the magnitude of the comparison voltage.

The offset-voltage calibration circuit may further include a DAC disposed at a front end of the comparator. The comparator may receive an output signal of the DAC as an input signal.

The offset-voltage calibration circuit may further include a switch configured to apply a common-mode voltage to input terminals of the comparator and the DAC to enable an offset-voltage calibration mode.

The comparator may include a pre-amplifier and a latch, which are connected in cascade. An output voltage of the pre-amplifier may be mirrored and applied to the latch.

The current DAC may control current applied to the latch to control the amount of current supplied from the node to which the comparison voltage is applied.

The current DAC may include two current DACs. Only one of the two current DACs may operate in response to the output signal of the UDC.

The current DAC may control the amount of current supplied from the node to which the comparison voltage is applied to equalize the at least two comparison voltages to each other.

The current DAC may include at least one switch, and the amount of current supplied from the node to which the comparison voltage is applied may depend on the number of turned-on switches among the switches.

The current DAC may further include a variable current source configured to supply current to the at least one switch.

The offset-voltage calibration circuit may further include a thermometer logic (TL) disposed between the UDC and the current DAC. The TL may allow a state of the current DAC to be sequentially changed in response to the output signal of the UDC.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF EXEMPLARY EMBODIMENTS

The present invention will now be described more fully hereinafter with reference to the accompanying drawings, in which exemplary embodiments of the invention are shown. Descriptions of well-known components and processing techniques are omitted so as not to unnecessarily obscure the embodiments of the present invention.

Embodiments

Figure 2:
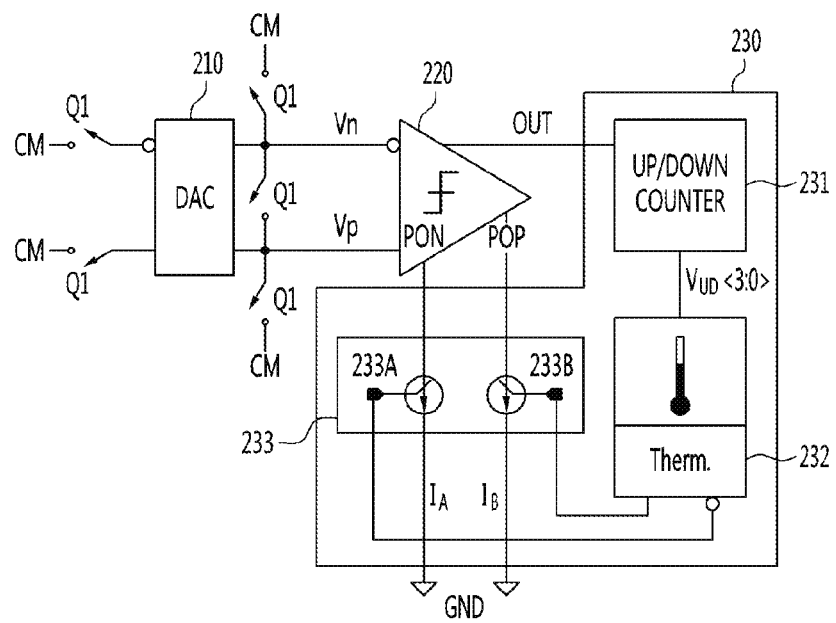
FIG. 2 is a circuit diagram of an offset-voltage removing circuit according to an exemplary embodiment of the present invention.

FIG. 2 is a circuit diagram of an offset-voltage removing circuit according to an exemplary embodiment of the present invention.

Referring to FIG. 2, an offset-voltage removing circuit according to the present invention may include a digital-to-analog converter (DAC) 210 and a comparator 220. Also, the offset-voltage removing circuit may further include an offset-voltage calibrator 230 configured to calibrate offset voltages of the DAC 210 and the comparator 220.

The offset-voltage calibrator 230 may include an up/down counter (UDC) 231, a thermometer logic (TL) 232, and a current DAC 233. The current DAC 233 may include two current DACs 233A and 233B.

Although FIG. 2 illustrates that the offset-voltage removing circuit is applied to the DAC 210, the offset-voltage removing circuit may be applied to any circuit to which the comparator 220 may be applied. For brevity, an example case where the offset-voltage removing circuit is applied to the DAC 210 will now be described.

Hereinafter, operation of the offset-voltage removing circuit of FIG. 2 will be described with reference to the timing diagram of FIG. 3.

Figure 3:
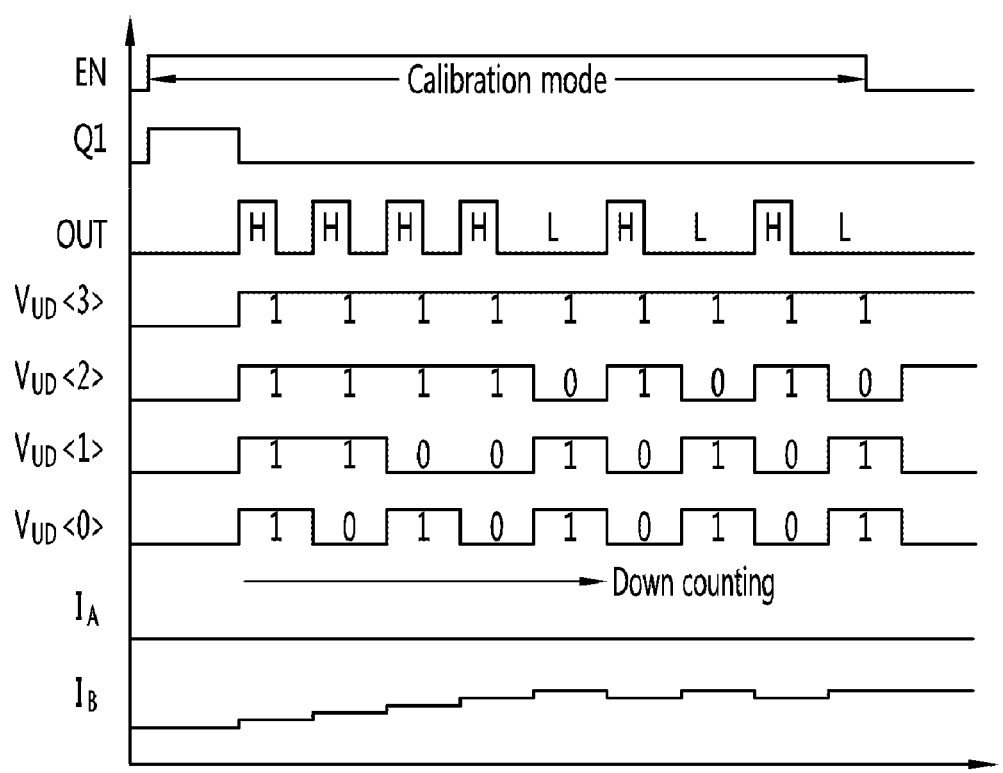
FIG. 3 is a timing diagram illustrating operating characteristics of an offset-voltage removing circuit according to an exemplary embodiment of the present invention.

The timing diagram of FIG. 3 was obtained using the offset-voltage calibrator 230 including a 4-bit UDC 231, a 3-bit TL 232, and a 3-bit current DAC 233. However, an offset voltage may be calibrated more precisely using the UDC 231, the TL, and the current DAC 233, which have higher resolutions.

When an offset-voltage calibration mode signal EN is not applied, predetermined input signals $V_{INB}$ and $V_{IN}$ may be applied to a capacitor array of the DAC 210. In this case, when the offset-voltage calibration mode signal EN is applied, the input signals $V_{INB}$ and $V_{IN}$ applied to the DAC 210 may be cut off, while a common-mode voltage CM may be applied to enter an offset-voltage calibration mode. In the present invention, when the offset-voltage calibration mode signal EN is applied, since the common-mode voltage CM may be simultaneously applied to an input terminal of the comparator 220 and an input terminal of the DAC 210, the offset voltage of not only the comparator 220 but also the DAC 210 may be calibrated.

When the common-mode voltage CM is applied to the DAC 210, the offset-voltage calibration mode may be enabled. Hereinafter, for brevity, a voltage of a node PON may be referred to as a first comparison voltage, while a voltage of a node POP may be referred to as a second comparison voltage. In an initial state, it is assumed that the first and second comparison voltages applied to the comparator 220 are not completely the same. That is, it is assumed for brevity that the comparator 220 has a predetermined offset voltage and the second comparison voltage is higher than the first comparison voltage. Since the second comparison voltage is higher than the first comparison voltage, the comparator 220 may output a high (H) signal as an output signal OUT.

When the output signal OUT of the comparator 220 is the high (H) signal, the 4-bit UDC 231 may perform down counting. Referring to FIG. 3, $V_{UD}<3>$, $V_{UD}<2>$, $V_{UD}<1>$, and $V_{UD}<0>$ respectively denote first, second, third, and least significant bits (LSB) in an output signal of the UDC 231. A most significant bit (MSB) of the output signal of the UDC 231 may be used as an enable signal of the current DAC 233. As stated above, the current DAC 233 may include two current DACs 233A and 233B. When an MSB output signal of the UDC 231 is a high or low signal, only one of the current DACs 233A and 233B may operate to control currents $I_A$ and $I_B$. For example, when the MSB output signal of the UDC 231 is a low signal, only the first current DAC 233A may operate to control the current $I_A$. Also, when the MSB output signal of the UDC 231 is a high signal, only the second current DAC 233B may operate to control the current $I_B$. Here, it is assumed that when the MSB of the output signal of the UDC 231 is at a high level, the second current DAC 233B is turned on. By operating only one of the two current DACs 233A and 233B according to the present invention, power consumption may be reduced compared to a conventional offset-voltage removing circuit configured to operate both of two current DACs.

Since the output signal OUT of the comparator 220 is the high (H) signal, the UDC 231 may continue to perform down counting and sequentially output signals, such as 1111, 1110, 1101, and 1100. Since the MSB output signal of the UDC 231 is a high signal, the current DCA 233B may be turned on. In this case, the current $I_B$ may be controlled in response to the output signal of the UDC 231. Each of the current DACs 233A and 233B may include a predetermined number of switches connected in parallel. The number of turned-on switches may be controlled in response to the output signal of the UDC 231, thereby controlling the magnitudes of currents $I_A$ and $T_B$. A detailed construction of the current DACs 233A and 233B will be described later. Here, an example case where when the UDC 231 performs down counting, the number of turned-on switches of the current DACs 233A and 233B is increased one by one will be described. In this case, when the UDC 231 performs down counting, the number of turned-on switches of the DAC 233B may be increased, and the current $I_B$ may be continuously increased. The voltages of the two nodes PON and POP may be reduced due to the flows of the currents $I_A$ and $I_B$, respectively. Here, since the current $I_B$ is continuously increased, the voltage of the node POP may be gradually reduced.

In this process, when the second comparison voltage becomes lower than the first comparison voltage, the comparator 220 may output a low (L) signal as shown in FIG. 3. Thus, the UDC 231 may perform up counting so that the number of turned-on switches among switches of the DAC 233B may be smaller by one than in the previous state to lessen the magnitude of the current $I_B$. As a result, the second comparison voltage may become higher than the first comparison voltage so that the comparator 220 may output a high (H) signal again. Thus, the UDC 231 may perform down counting again to restore the current $I_B$ to a previous state, and the second comparison voltage may become lower than the first comparison voltage again. By repeating the above-described process, the offset voltage may be calibrated, so that the offset voltages can be effectively removed from the DAC 210 and the comparator 220.

Although a description of the function of the TL 232 is omitted above, the TL 232 may make operations of the current DAC 233 smooth and precise. Specifically, when the TL 232 is omitted, switches of the current DACs 233A and 233B may remain turned off each time states of the current DACs 233A and 233B are changed. For example, when the UDC 231 performs down counting and the number of turned-on switches of the current DAC 233B is changed from 4 to 5, all four switches may be turned off, and then five switches may be turned on. The TL 232, which may prevent the above-described phenomenon, may allow only one additional switch to be turned on when the four switches are turned on. That is, the TL 232 may facilitate the operation of the current DAC 233. The TL 232 may be used to enable precise calibration of an offset voltage or omitted to simplify circuit configuration.

Hereinafter, a detailed construction of the comparator 220 included in the offset-voltage calibration circuit of FIG. 2 will be described.

Comparator

Figure 4:
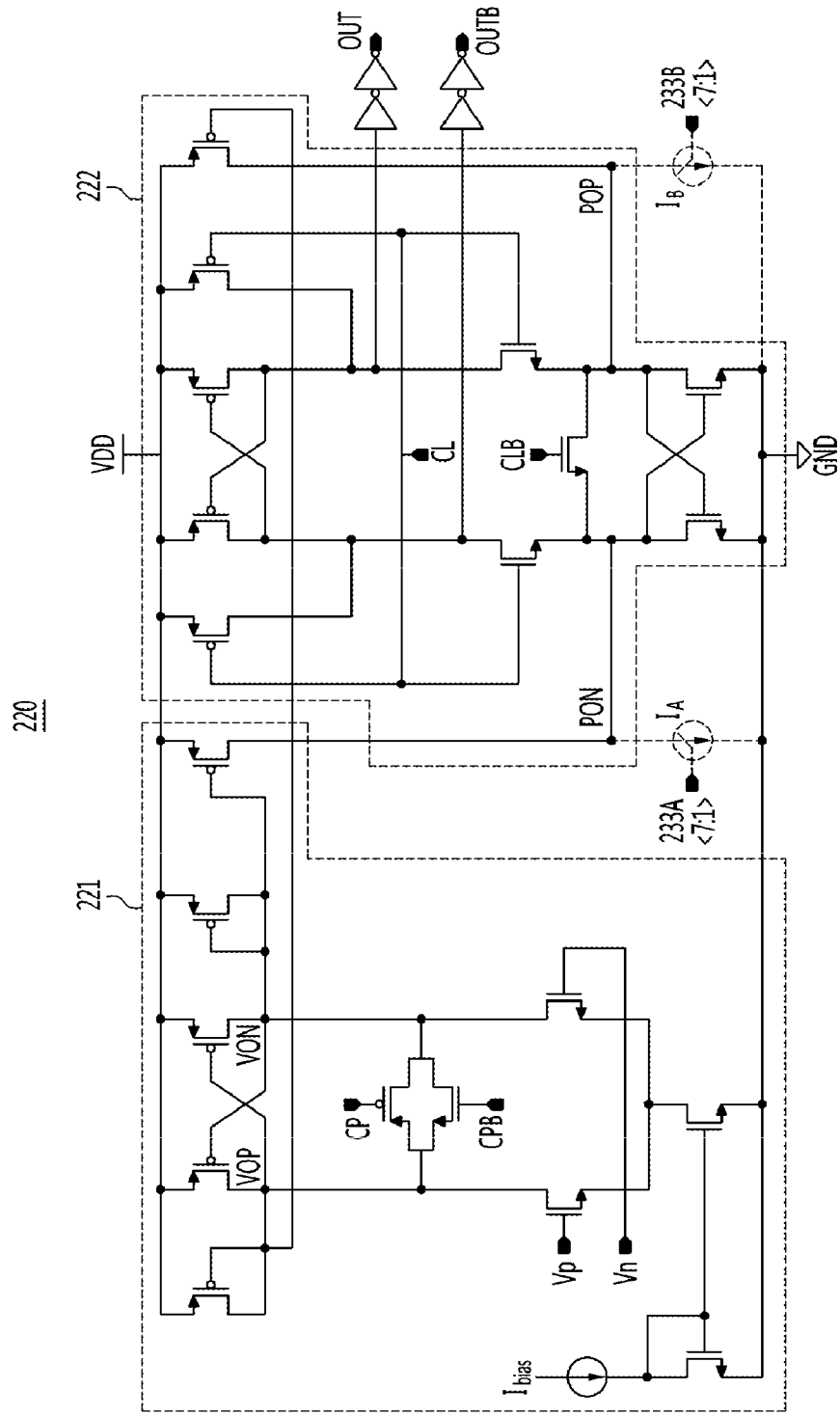
FIG. 4 is a circuit diagram of an internal construction of a comparator according to an exemplary embodiment of the present invention.

FIG. 4 is a circuit diagram of an internal construction of an offset-voltage calibration circuit according to an exemplary embodiment of the present invention.

Referring to FIG. 4, the comparator 220 according to an exemplary embodiment of the present invention may include a pre-amplifier 221 and a latch 222, which are connected in cascade.

Figure 1:
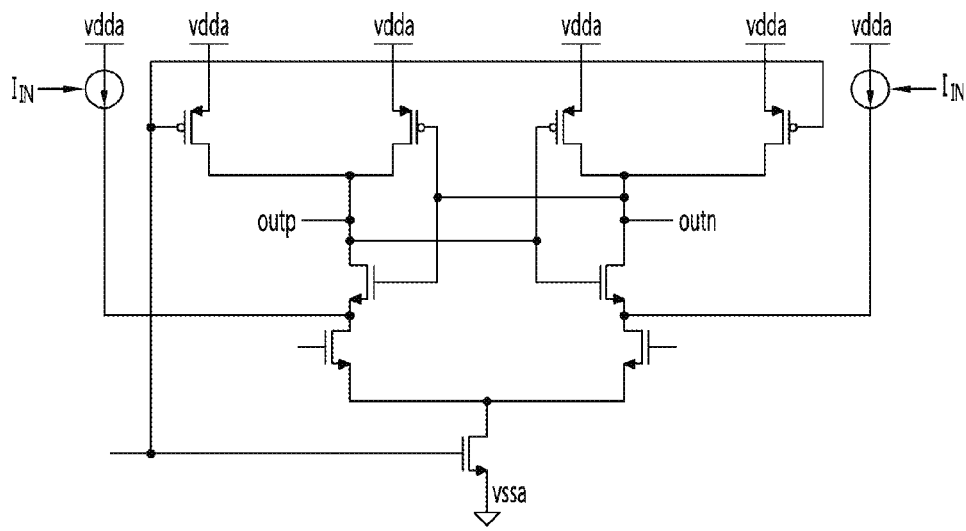
FIG. 1 is a circuit diagram of a comparator to which a conventional offset-voltage removing technique is applied.

Referring to FIG. 4, the comparator 220 may differ from the conventional comparator of FIG. 1 in that an output signal of the pre-amplifier 221, which may be output from nodes VOP and VON, is not used as an input signal of the latch 222 but mirrored and a mirrored output signal, which is output from nodes PON and POP, is used as the input signal of the latch 222. Thus, a kick-back effect caused by a parasitic capacitance between gate and drain electrodes of a transistor included in the comparator 220 may be minimized.

Meanwhile, referring to FIG. 4, current DACs 233A and 233B may be connected to a path of current supplied to the latch 222 of the comparator 220. The current DACs 233A and 233B may not supply additional current to the circuit of the comparator 220 but allow current supplied to the comparator 220, specifically, current supplied to the latch 222, to partially flow from the respective nodes PON and POP toward a ground. Thus, the current DACs 233A and 233B may operate without additional current consumption. That is, the conventional comparator of FIG. 1 needs to include an additional current source $I_{IN}$ configured to supply additional current from a power supply terminal VDD to an input node. However, the comparator 220 of FIG. 4, according to the present invention may enable normal operations without an additional current source.

Meanwhile, a typical clock signal, for example, a clock signal disclosed in Korean Patent Application No. 2008-0131613 entitled "High-speed multi-stage voltage comparator" may be used as a clock signal required for operation of the comparator 220. In FIG. 4, signals CP/CPB and CL/CLB may be clock signals. Malfunctions may be likely to occur in the pre-amplifier 221 due to the previous value. To prevent the malfunctions, the signals CP and CPB may reset every operation. In other words, the signals CP and CPB may function as rest signals of the pre-amplifier 221. Meanwhile, the signals CL and CLB may enable operations of the latch 222. In other words, the latch 222 may operate when the signal CL is at a high level.

Hereinafter, a detailed construction of current DACs 233A and 233B included in the offset-voltage calibration circuit of FIG. 2 will be described.

Current DAC

Figure 5:
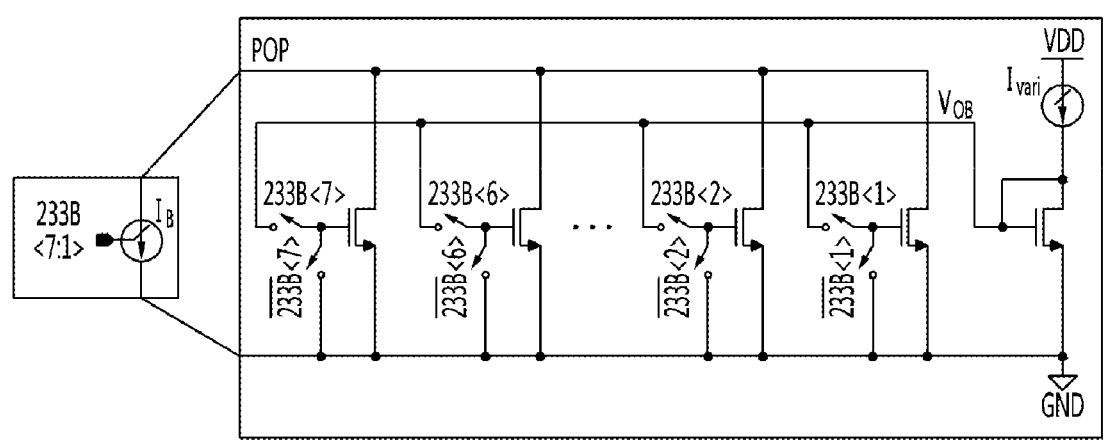
FIG. 5 is a circuit diagram of an internal construction of a current digital-to-analog converter (DAC) according to an exemplary embodiment of the present invention.

FIG. 5 is a circuit diagram of an internal construction of a current DAC according to an exemplary embodiment of the present invention.

Although FIG. 5 exemplarily illustrates the construction of the current DAC 233B, the current DAC 233B may have the same construction as the current DAC 233A.

Referring to FIG. 5, the current DAC 233B may include at least one transistor. The at least one transistor may be an n-type transistor or a p-type transistor or replaced by another typical switch.

As described above, operations of transistors of the current DAC 233B may be controlled in response to the output signal of the UDC 231. Switches 233B<1>, 233B<2>, ..., and 233B<7> may be disposed at gates of the transistors, respectively, so that the operations of the transistors may depend on on/off operations of the switches 233B<1>, 233B<2>, ..., and 233B<7>. As described above as an example, when it is assumed that the UDC 231 is a 4-bit UDC and an MSB is used as an enable signal of the current DACs 233A and 233B, a variable number of output signals of the UDC 231, which may control the current DACs 233A and 233B, may be 8. Thus, in this case, the DAC 233B may include 7 transistors to generate 8 different currents as shown in FIG. 5. Specifically, when the switches 233B<1>, 233B<2>, ..., and 233B<7> disposed at the gates of the 7 transistors are turned on and off, it may be determined whether a current source $I_{vari}$ supplies current to gates of the 7 transistors functioning as switches, so that the magnitude of current supplied to a drain of each of the transistors may depend on the determination result. The sum of currents supplied to drains of the respective transistors may correspond to current $I_B$ supplied from a node of the comparator 220 to which a second comparison voltage POP is applied. Specifically, the number of turned-on switches among switches 233B<1>, 233B<2>, ..., and 233B<7> included in the current DAC 233B may be determined in response to output signals 1000, 1001, 1010, 1011, 1100, 1101, 1110, and 1111 of the UDC 231, so that the magnitude of the current $I_B$ may depend on the determination result. In the current DAC 233B according to the present invention, the magnitude of current supplied by the current source $I_{vari}$ may be varied, so that the current supplied to the current DAC 233B may be controlled to a desired magnitude and an offset voltage may be calibrated in a wide region irrespective of the magnitude of the offset voltage. Specifically, in a conventional current DAC, a current source may be configured to supply a predetermined magnitude of current. In this case, the magnitude of the offset voltage should be predicted and the magnitude of current to be supplied should be previously determined based on the prediction result. In comparison, according to the present invention, since the magnitude of current supplied by the current source $I_{vari}$ is variable, predicting the magnitude of the offset voltage may be unnecessary.

According to the present invention, since a circuit, such as an SAR ADC, applies a signal for enabling an offset-voltage calibration mode to a front end of a DAC, an offset voltage of not only a comparator but also the DAC may be calibrated.

Also, according to the present invention, since a current source configured to supply current to a comparator is embodied as a variable current source, even if an offset voltage departs from a predicted range of offset voltages, the offset voltage may be calibrated without changing a circuit design.

Furthermore, according to the present invention, a comparison voltage applied to the comparator may be controlled by adjusting the amount of current supplied to the comparator without an additional current source, thereby preventing an increase in the entire power consumption.

Although exemplary embodiments of the present invention have been described with reference to the attached drawings, the present invention is not limited to these embodiments, and it should be appreciated to those skilled in the art that a variety of modifications and changes can be made without departing from the spirit and scope of the present invention.

What is claimed is:

1. An offset-voltage calibration circuit comprising:
a comparator configured to receive at least two comparison voltages and output a result of a comparison between the comparison voltages;
an up/down counter (UDC) configured to output an up-counting or down-counting output signal in response to an output signal of the comparator; and
a current digital-to-analog converter (DAC) configured to control an amount of current supplied from a node to which each of the comparison voltages is applied, in response to an output signal of the UDC, and control a magnitude of each of the comparison voltages,
wherein the current DAC comprises first and second current DACs, and
wherein the first and second current DACs selectively operate in response to the output signal of the UDC.

2. The circuit of claim 1, further comprising a DAC disposed at a front end of the comparator,
wherein the comparator receives an output signal of the DAC as an input signal.

3. The circuit of claim 2, further comprising a switch configured to apply a common-mode voltage to input terminals of the comparator and those of the DAC to enable an offset-voltage calibration mode.

4. The circuit of claim 1, wherein the comparator comprises a pre-amplifier and a latch, which are coupled in cascade, and
wherein an output voltage of the pre-amplifier is mirrored and applied to an input terminal of the latch.

5. The circuit of claim 4, wherein the current DAC controls current applied to the latch by controlling the amount of current supplied from the node to which each of the comparison voltages is applied.

6. The circuit of claim 4, wherein the input terminal of the latch corresponds to the node to which each of the comparison voltages is applied.

7. The circuit of claim 1, wherein the current DAC controls the amount of current supplied from the node to which each of the comparison voltages is applied to equalize the at least two comparison voltages to each other.

8. The circuit of claim 1, wherein each of the first and second current DACs comprises one or more switches, and the amount of current supplied from the node to which each of the comparison voltages is applied depends on the number of turned-on switches among the switches.

9. The circuit of claim 8, wherein each of the first and second current DACs further comprises a variable current source configured to supply current to the switches.

10. The circuit of claim 1, further comprising a thermometer logic (TL) disposed between the UDC and the current DAC and configured to allow a state of the current DAC to be sequentially changed in response to the output signal of the UDC.

11. The circuit of claim 1, wherein the comparator is configured to receive first and second comparison voltages,
wherein the first current DAC is configured to control an amount of current supplied from a first node to which the first comparison voltage is applied, in response to the output signal of the UDC, thereby controlling a magnitude of the first comparison voltage, and
wherein the second current DAC is configured to control an amount of current supplied from a second node to which the second comparison voltage is applied, in response to the output signal of the UDC, thereby controlling a magnitude of the second comparison voltage.

12. The circuit of claim 1, wherein the output signal of the UDC includes a plurality of bits,
wherein the first current DAC operates when an most significant bit (MSB) of the plurality of bits is a first value, and
wherein the second current DAC operates when the MSB of the plurality of bits is a second value.

13. An offset-voltage calibration circuit, comprising:
a comparator configured to receive at least two comparison voltages and output a result of a comparison between the comparison voltages;
an up/down counter (UDC) configured to output an up-counting or down-counting output signal in response to an output signal of the comparator;
a current digital-to-analog converter (DAC) configured to control an amount of current supplied from a node to which each of the comparison voltages is applied, in response to an output signal of the UDC, and control a magnitude of each of the comparison voltages; and
a thermometer logic (TL) disposed between the UDC and the current DAC and configured to allow a state of the current DAC to be sequentially changed in response to the output signal of the UDC.

14. The circuit of claim 13, wherein the current DAC comprises two current DACs, and
wherein only one of the two current DACs operates in response to the output signal of the UDC.

15. The circuit of claim 13, further comprising a DAC disposed at a front end of the comparator,
wherein the comparator receives an output signal of the DAC as an input signal.

16. The circuit of claim 15, further comprising a switch configured to apply a common-mode voltage to input terminals of the comparator and those of the DAC to enable an offset-voltage calibration mode.

17. The circuit of claim 13, wherein the comparator comprises a pre-amplifier and a latch, which are coupled in cascade, and wherein an output voltage of the pre-amplifier is mirrored and applied to an input terminal of the latch.

18. The circuit of claim 17, wherein the current DAC controls current applied to the latch by controlling the amount of current supplied from the node to which each of the comparison voltages is applied.

19. The circuit of claim 13, wherein the current DAC controls the amount of current supplied from the node to which each of the comparison voltages is applied to equalize the at least two comparison voltages to each other.

20. The circuit of claim 13, wherein each of the first and second current DACs comprises one or more switches, and the amount of current supplied from the node to which each of the comparison voltages is applied depends on the number of turned-on switches among the switches.

* * * * *